United States Patent

Bartha et al.

Patent Number: 5,296,091
Date of Patent: Mar. 22, 1994

[54] METHOD OF ETCHING SUBSTRATES HAVING A LOW THERMAL CONDUCTIVITY

[75] Inventors: Johann Bartha; Thomas Bayer, both of Sindelfingen; Johann Greschner, Pliezhausen, all of Fed. Rep. of Germany; Dieter Kern, Amawalk, N.Y.; Volker Mattern, Boeblingen; Roland Stoehr, Nufringen, both of Fed. Rep. of Germany

[73] Assignee: International Business Machines Corporation, Armonk, N.Y.

[21] Appl. No.: 768,490

[22] Filed: Sep. 30, 1991

Related U.S. Application Data

[62] Division of Ser. No. 422,928, Oct. 17, 1989, abandoned.

[30] Foreign Application Priority Data

Oct. 19, 1988 [EP] European Pat. Off. ........ 88117372.8

[51] Int. Cl.⁵ .............................................. B01J 15/00
[52] U.S. Cl. .................................... 156/643; 156/646; 156/668; 156/644; 204/192.36
[58] Field of Search ............... 156/644, 643, 646, 668, 156/345; 204/192.36, 298.31, 298.34

[56] References Cited

U.S. PATENT DOCUMENTS

| | | | |
|---|---|---|---|
| 3,884,787 | 5/1975 | Kuehnle | 204/298.24 |
| 4,129,881 | 12/1978 | Reichel et al. | 357/82 |
| 4,282,924 | 8/1981 | Faretra | 165/80 |
| 4,399,016 | 8/1983 | Tsukada et al. | 204/192 |
| 4,514,636 | 4/1985 | King | 250/443.1 |
| 4,624,728 | 11/1986 | Bithell et al. | 156/345 |
| 4,736,087 | 4/1988 | Whitlock et al. | 156/646 X |
| 4,999,320 | 3/1991 | Douglas | 156/345 |

FOREIGN PATENT DOCUMENTS

0072673 2/1983 European Pat. Off. .
0115970 8/1984 European Pat. Off. .
0283545 9/1988 European Pat. Off. .
0283546 9/1988 European Pat. Off. .

OTHER PUBLICATIONS

Durney, *Electroplating Engineering Handbook*, 4th Edition, Van Nostrand Reinhold Company, Inc., 1984, p. 396.

Yamamoto, S., "Substrate Holder for Electron Beam Exposing Unit", Patent Abstracts of Japan, vol. 7, No. 99 (E-172) (1244) (Apr. 27, 1983).

Ishikawa, T., "Wafer Holder", Patent Abstracts of Japan, vol. 8, No. 198 (E-265) (1635) (Sep. 11, 1984).

"Backside Etch of Silicon Nitride on Device Wafers", Research Disclosure, Emsworth, Hampshire, GB, No. 26238 (Feb. 1986).

Fortuno, G., et al., "Electrostatic Wafer Holder for Wafer Cooling During Reactive Ion Etching", IBM Tech. Discl. Bull., vol. 31, No. 1 (Jun. 1988) pp. 462–464.

*Primary Examiner*—Thi Dang
*Attorney, Agent, or Firm*—William D. Sabo

[57] ABSTRACT

Disclosed is a vacuum reactor for etching substrates having a low thermal conductivity to a high degree of etch rate uniformity, wherein the substrates to be etched are arranged in a holder at a predetermined spacing from the cathode to which RF energy is applied. According to a preferred embodiment of the invention, the cathode is raised in the area of the substrate to be etched to within a spacing of about 0.2 mm from the bottom side of the substrate. The cathode is made of aluminium, and is provided in the area of the substrate to be etched with a layer which acts as a black radiator. The heat formed during RIE is removed by radiation, and the radiation reflected from the cathode to the substrate is absorbed by the layer. Also disclosed is a method of etching substrates having a low thermal conductivity, in particular plastic substrates.

6 Claims, 2 Drawing Sheets

METHOD OF ETCHING SUBSTRATES HAVING A LOW THERMAL CONDUCTIVITY

This is a divisional application of application Ser. No. 07/422,928, filed Oct. 17, 1989, now abandoned.

FIELD OF THE INVENTION

This invention relates to an apparatus for plasma or reactive ion etching (RIE) and to a method of etching substrates having a low thermal conductivity, in particular plastic substrates, in such apparatus.

BACKGROUND OF THE INVENTION

In the past few years, the etching of semiconductor substrates, dielectric materials and plastic substrates has been marked by a shift from wet chemical to what is known as dry or plasma etch processes. Such "dry" processes, i.e. processes carried out in a vacuum, which are used primarily in semiconductor technology but also in the processing of plastic materials, require an accurate temperature control. Thus, for example, etch processes, such as PE (plasma etching), RIE (reactive ion etching), ECR (electron cyclotron resonance plasma etching), MRIE (magnetic confinement reactive ion etching), triode etching, CAIBE (chemically assisted ion beam etching), photon assisted etching, and the like, necessitate cooling to prevent damage to the substrates to be etched or the films, such as photoresist films, arranged thereon.

Therefore, substrate holders are generally heated to a moderate temperature by scavenging them with liquids, such as water or special oils. Heat transfer between the substrate and the substrate holder is, however, impeded by the gap existing therebetween, which has led to a number of suggestions as to how this might be remedied. U.S. Pat. No. 4,282,924, for example, describes an apparatus for ion implantation, wherein the substrates are pressed against the convexly curved surface of a substrate holder by means of a ring or clamps, and heat transfer between the substrates and the substrate holder, through which the cooling liquid flows, is improved by a thin intermediate layer of an elastomer. U.S. Pat. No. 4,399,016 describes a substrate holder, wherein contact to the substrate is improved by the latter being fixedly attached by electrostatic attraction between the substrate and the substrate holder electrically insulated therefrom. Heat transfer can also be improved by filling the gap between the substrate and the substrate holder with a liquid metal (U.S. Pat. No. 4,129,881).

During vacuum treatment, an article is best cooled by introducing a gas with a high thermal conductivity between the article to be treated, such as, a semiconductor wafer, and the substrate holder. Suitable gases are nitrogen, neon, hydrogen and, in particular, helium (U.S. Pat. No. 4,514,636 and many others). Effective heat transfer between the semiconductor wafer and the substrate holder is ensured only if a static gas pressure ranging from about 1.33 to 13.3 mbar, preferably of about 1.33 mbar, is maintained between the two elements. This, in turn, requires that the substrates to be treated be mechanically or electrostatically fixed to the liquid-cooled substrate holder and be sealed from the reaction chamber to prevent an ingress of heat-transferring gas which might noticeably affect the production result.

The previously-described apparatus and methods require mechanically stable substrates which may be readily clamped and sealed from the reaction chamber. In any of these cases, heat transfer is effected by heat conductance in the material or by convection in gas, with the uniformity of cooling depending respectively on the support of the substrate on the substrate holder and the homogeneity and pressure of the heat-conducting gas. Only in a few special cases will the entire substrate surface rest on the substrate holder. Normally, the support will be a multi-point support which poses no problems where the etch rate, as, for example, during plasma or reactive ion etching, is independent of temperature and/or where the thermal conductivity of the substrates to be etched is very high, also ensuring a uniform substrate temperature.

There are, however, substrate materials whose etch rate is strongly temperature-dependent. This holds in particular for plastic substrates. Plastic materials frequently have a low thermal conductivity so that highly irregular etch rates may occur if the substrates are fixed and cooled as described in the previously-cited prior art. Thus, for instance, etch rate differences of more than a factor of two have been detected within a few square centimeters of substrate surface during the reactive ion etching of substrates of polyoxymethylene homo- or copolymers, leading to poor yield.

SUMMARY OF THE INVENTION

It is, therefore, an object of the invention to provide an apparatus for plasma or reactive ion etching substrates having a low thermal conductivity, in particular plastic substrates, wherein the substrates may be heated and treated uniformly across their entire surface.

Now, there is provided an improvement in a vacuum reactor for etching a substrate having a low thermal conductivity to a high degree of etch rate uniformity, comprising a process chamber, means for introducing a process gas into the process chamber, means for connecting a vacuum pump to the process chamber, an electrode mounted in the process chamber, a counterelectrode in the process chamber, a substrate holder associated with the electrode for supporting a substrate to be etched and an energy source for applying RF energy to one of the electrode or the counterelectrode. According to the invention, the substrate holder is arranged at a predetermined spacing from the electrode and the electrode is provided with a radiation-absorbing layer.

The invention also provides an improved method of etching a substrate having a low thermal conductivity in a vacuum reactor as described above at a pressure ranging from about 100 to about $10^{-3}$ mbar by electrically or optically energized particles, using a process gas supplying the particles. According to this aspect of the invention, the method involves maintaining the substrate at a predetermined distance from the electrode surface and removing the heat formed during etching by radiation.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

During the plasma or reactive ion etch process, the substrates to be treated are positioned on the lower temperature-controlled electrode of a parallel plate reactor which is normally grounded during plasma etching and to which a voltage is applied during reactive ion etching. The pressures used are between about 100 and about $10^{-3}$ mbar, with the pressures employed for reactive ion etching ranging from about $10^{-2}$ to about $10^{-3}$ mbar. The respective pressure is controlled by the capacity of the vacuum pump and the total flow of the process gas which is typically between about 3 and about 300 sccm. The process gas is electrically or optically energized. Electrical energization may be effected by a low-temperature plasma discharge which is produced by single-phase D.C. or two-phase A.C., whereas optical energization may be effected, for example, by laser beams or ultraviolet light. As the energized particles, such as ions, radicals, atoms or molecules impinge upon the substrates to be treated, a sizeable energy flux is induced into the substrates, causing the latter to be heated which, as previously described, must be checked by controlling the temperature of the substrate holder.

The method according to the invention will be described with reference to the production of arbitrarily shaped micromechanical components of plane-parallel plates of polymer material or arbitrarily shaped throughholes produced therein by reactive ion etching. This process forms the subject-matter of European Patent application 87104580.3. The plane-parallel plates of polyoxymethylene homo- or copolymers comprising circular and elongated holes produced by the process described in that application are preferably used in a wire guide concept of test heads for multilayer ceramic substrates. Test heads of this type are covered by the subject-matter of European Patent application 87104577.9.

Figure 4:
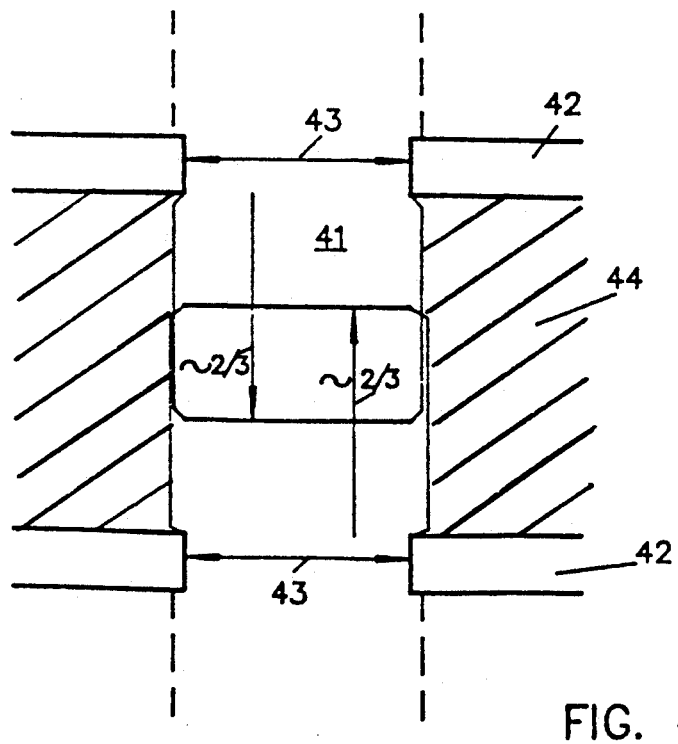
FIG. 4 shows an enlarged cross-sectional view of a throughhole in a plastic substrate after reactive ion etching.

The process described in European Patent application 87104580.3 provides for throughholes 41 (FIG. 4) to be produced by reactive ion etching in about 1 mm thick polyoxymethylene plates (commercially available under the designation "Delrin" from E. I. duPont de Nemours) having a diameter of about 2 to about 5 cm. For this purpose, the substrates 44 which are bilaterally covered with photoresist masks 42 with apertures 43 are introduced into an RIE system, such as Leybold-Heraeus VZK 550 A. The throughholes 41 are reactive ion etched into the Delrin substrate 44, first from the front side and then, after the sample has been turned, from the back side down to a depth of about ⅔ of the substrate thickness. As the two etch zones overlap in the center region, high-quality throughholes, i.e., strictly vertical openings with excellent positional tolerance of the entry and exit holes on the front and back sides, may be etched.

RIE is preferably effected in an oxygen plasma containing, if desired, up to about 50% argon, at a gas flow of about 5 to about 100 sccm, a pressure range of about 1 to about 50 μbar and a single-phase D.C. bias of about 200 to about 900 V for a time sufficient to obtain the desired etch depth. The parameters of the above-described RIE system are as follows:

| | |
|---|---|
| pressure: | 10 μbar |
| gas flow: | 30 sccm oxygen, 12 sccm argon |
| HF amplitude: | 900 V |
| single-phase D.C. bias: | 890 V |
| substrate temperature: | 70° C. |
| etch rate: | 1.25 μm/min. |

As previously mentioned, plastic materials generally have a low thermal conductivity. The plastic material, Delrin, for instance, has a thermal conductivity of about 0.3 Watt/m×°C. and a thermal coefficient of expansion of about $110 \times 10^{-6}$ per °C. A silicon wafer by comparison has a thermal conductivity of about 157 Watt/m×°C. and a thermal coefficient of expansion of about $2.33 \times 10^{-6}$ per °C. In addition to its low thermal conductivity, the etch rate of Delrin is strongly temperature-dependent. Therefore, it is essential that the substrates are effectively cooled to ensure that they are uniformly heated to a moderate temperature during RIE. However, the Delrin substrates may not be fixed to the cathode as described in the above-mentioned references, as, owing to the high coefficient of expansion of Delrin, the planarity of the Delrin substrates, in comparison with a silicon wafer, for example, would no longer be ensured.

To eliminate the problems of substrate cooling by heat conductance for substrates with a low thermal conductivity or plastic substrates, the invention provides for the substrates to be fixed to a suitable cathode such that the resultant heat is substantially removed by radiation. For this purpose, the substrate must be arranged at a predetermined spacing above the cathode and fixed without any tension. As the RIE process is carried out within a pressure range of about $10^{-2}$ to about $10^{-3}$ mbar, heat removal by gas convection is largely negligible, since cooling by gas convection only becomes effective at a gas pressure of about 1.33 mbar. See U.S. Pat. No. 4,514,636 and G. Fortuno et al., "Electrostatic Wafer Holder For Wafer Cooling During Reactive Ion Etching", IBM Tech. Discl. Bull., Vol. 31, No. 1 (June 1988), pp. 462–464.

Figure 1:
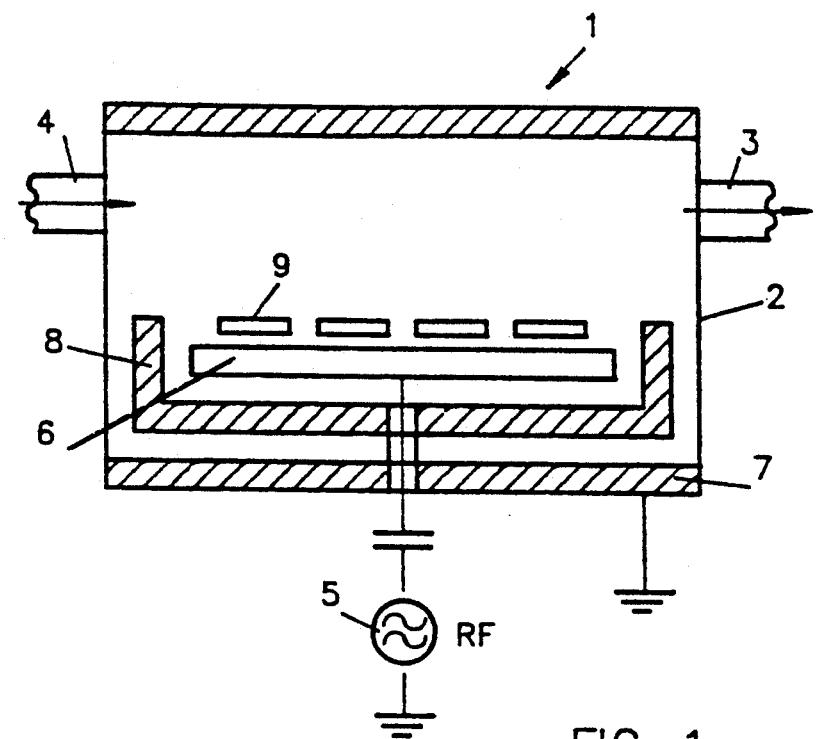
FIG. 1 shows an apparatus for treating a substrate in a reactive ion etch process.
Figure 2:
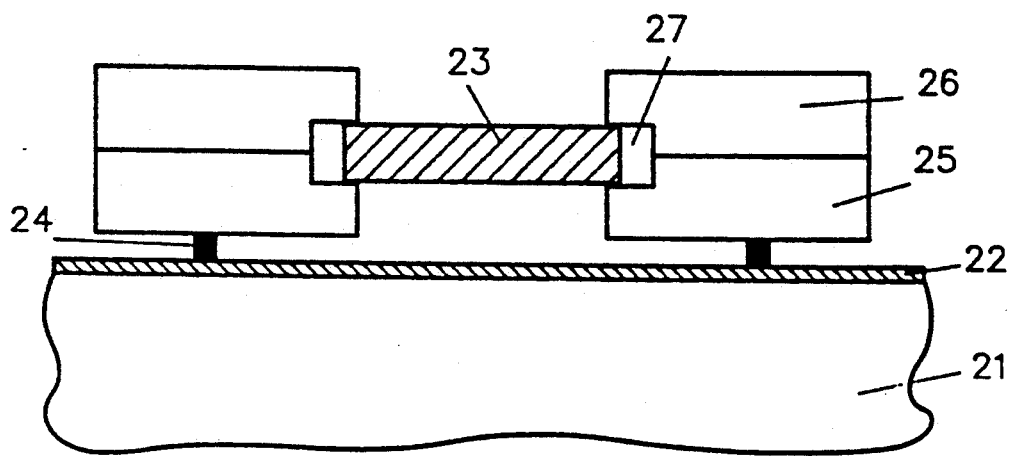
FIG. 2 shows part of a cathode arrangement according to FIG. 1.
Figure 3:
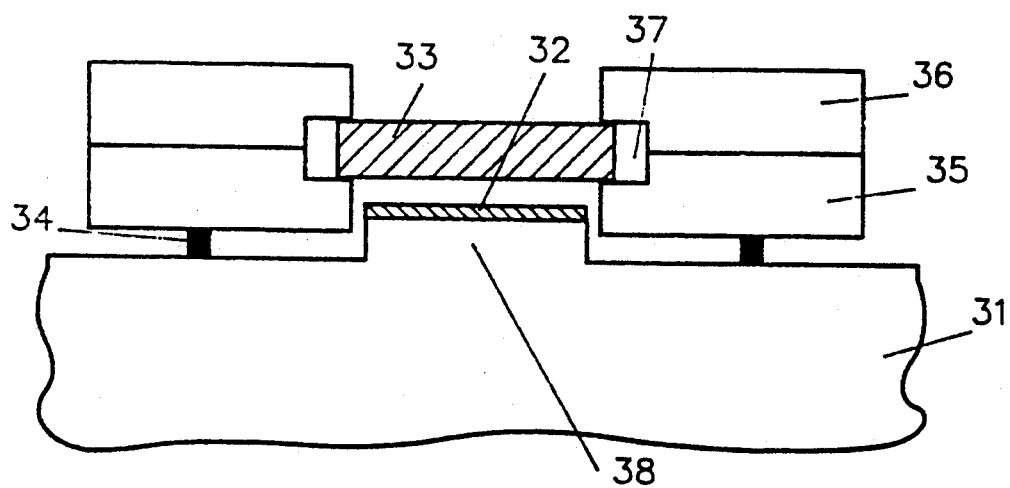
FIG. 3 shows part of another cathode arrangement according to FIG. 1.

FIGS. 1 to 3 show, respectively, an apparatus and two cathodes with holders in which the substrates are positioned at a predetermined spacing above the cathode during RIE. FIG. 1 shows an RIE system 1 with a process chamber 2, which is designed as a vacuum recipient and which comprises a connector 3 to a vacuum pump and an inlet 4 for introducing a process gas. Chamber 2 also comprises an energy source 5 from which the cathode 6 receives electric energy. The back side of the cathode 6 is surrounded by a grounded screen 8, and the wall of the chamber 2 is formed by the grounded anode 7. The substrates to be etched 9 are arranged in a holder at a predetermined spacing above the cathode 6. Relevant details are shown in FIGS. 2 and 3.

FIG. 2 shows in a two-piece ceramic frame 25 and 26 a Delrin substrate 23 to be etched bilaterally. The ceramic frame is forced against the cathode by spacers 24 having a low thermal conductivity. To permit the Delrin substrate to expand during heating, hollow spaces 27 are provided on either side of the holders. The cathode 21 is made of aluminium and is provided on its surface with a black radiator 22, such as an anodized layer. The black anodized surface is particularly advantageous, since it acts as an absorber and is resistant during RIE. The spacing of the substrate from the cathode is about 0.5 mm in the illustrated arrangement.

In all tests, the substrate temperature is measured by a pyrometer.

If the substrate, as provided in the art, is arranged to directly contact the cathode, then a particular plasma potential, such as about 660 V RF, and removal of the heat produced in the substrate by conductance to the cathode will produce a substrate temperature of about 40° C.

In a further test, the substrate is positioned at a spacing of about 3 mm to "float" above a cathode, whose surface is not provided with a black radiator. At the same plasma potential, the final temperature of the substrate is about 93° C. This is due to the fact that the substrate is practically supported only on two quartz spacers which permit only very little heat to be conducted to the cathode, with most of the plasma-produced heat in the substrate being removed by radiation. The noticeably higher substrate temperature in this arrangement may be a disadvantage which has to be accepted as a trade-off for an arrangement in which the substrates are directly supported on the cathode. A great advantage of such an arrangement is that for substrates with a low characteristic thermal conductivity, a much more uniform temperature distribution and, thus, an improved uniformity of the etch rate is obtained.

Measurements have shown that with the above-described substrate holder, the heat radiated from the substrate in the direction of the aluminium cathode is largely reflected by the aluminium surface, so that, as a result, the substrate is additionally heated. By coating the aluminium surface with a black radiator or by anodizing such surface (FIG. 2), this radiation may be absorbed, lowering the substrate temperature from about 93° C. to about 70° C. The spacing of the substrate from the cathode is about 0.5 mm. The cathode arrangement depicted in FIG. 2 is able to achieve a very favorable uniform temperature and etch rate. It may be desirable, however, to also improve the electrical uniformity, i.e., during RIE care must be taken so that the ions are perpendicularly incident on the substrate.

An undisturbed perpendicular incidence of the ions on the cathode surface during RIE is ensured only with a totally planar cathode surface of infinite extension. Any geometrical irregularity of the cathode surface will lead to a warping of the equipotential surfaces, so that they are no longer parallel to the substrate surface, and, since the three-dimensional course of the equipotential surfaces determines the ion paths, to a disturbed perpendicular incidence of the ions. The arrangement of FIG. 2, for example, acts as a non-planar dielectric in a plate capacitor which is formed by the edge of the dark space and the cathode surface. It can be proven by experiment that the etch structures located close to the edges of the ceramic holders 25 and 26 are etched obliquely. This is negligible if the etch structures are not too deep. If, on the other hand, their depth is great or if throughholes are to be etched, for example, into Delrin substrates (FIG. 4), obliquely etched structures are no longer tolerable.

The result of the experiment can be confirmed by computation. Computation was based on a spacing of 0.2 mm between the ceramic and the cathode surface, a thickness of 0.8 mm for the ceramic holding lips and a thickness of 1 mm for the Delrin substrates. The dielectric constants used were $\epsilon=2.9$ for Delrin and $\epsilon=9$ for ceramic. The size of the dark space during RIE was 15 mm and the D.C. potential was 500 V. Computation showed that an ion incident on a 1 mm thick substrate in a substrate holder (FIG. 2) at a spacing of about 4 mm from the ceramic edge is inclined by about 1.5° to the vertical, which at a substrate thickness of 1 mm corresponds to a stagger of the holes on the front and back sides of 28.92 $\mu m$.

The effect of oblique etching can be reduced by the arrangement illustrated in FIG. 3. FIG. 3 depicts in a two-piece ceramic frame 35 and 36 a Delrin substrate 33 to be etched bilaterally. The ceramic frame is forced against the cathode by spacers 34 having a low thermal conductivity.

To permit the Delrin substrate to expand during heating, hollow spaces 37 are provided on either side of the holders. Cathode 31 is made of aluminium. It differs from the arrangement of FIG. 2 in having a modified cathode surface. In the area of the substrate to be etched 33, cathode 31 is raised in the form of a pedestal to within a spacing of about 0.2 mm from the bottom side of the substrate. In the area of the substrate, the cathode surface is provided with a black radiator 32, in this preferred embodiment with an anodized layer. This particular design of the cathode, which ensures that the ions are perpendicularly incident, in particular in the peripheral region of the substrate holder, reduces errors resulting from oblique etching by about 50 percent. The results of the experiment were also confirmed by computation.

With the aid of the cathode/holding means arrangements, (FIGS. 2 and 3), a wide variety of substrates having a low thermal conductivity and which are sensitive to temperature during RIE can be etched highly uniformly. With regard to electrical uniformity, the arrangement of FIG. 3 is particularly advantageous. The high degree of etch rate uniformity permits a noticeable improvement in the yield of etch process, in particular those used to etch wire guide plates of Delrin.

While the invention has been particularly shown and described with reference to preferred embodiments thereof, it will be understood by those skilled in the art that various changes in form and details may be made therein without departing from the spirit and scope of the invention.

What is claimed is:

1. A method of etching a substrate having a low thermal conductivity and which is sensitive to temperature to a high degree of etch rate uniformity, in a vacuum reactor at a pressure ranging from about 100 to $10^{-3}$ mbar by electrically or optically energized particles, using a process gas supplying said particles, said vacuum reactor comprising a process chamber, means for introducing said process gas into said process chamber, means for connecting a vacuum pump to said process chamber, and electrode mounted in said process chamber, a counterelectrode in said process chamber, a substrate holder associated with said electrode for supporting a substrate to be etched and an energy source for applying RF energy to one of said electrode and said counterelectrode, said method comprising: maintaining the substrate at a predetermined distance from said electrode surface, said predetermined distance being at least about 0.2 mm from said electrode surface, and wherein the heat reflected from said electrode to the substrate is absorbed by a layer disposed on said electrode surface.

2. The method of claim 1, wherein said substrate is maintained at a predetermined distance of about 0.2 to about 3 mm from said electrode surface.

3. The method of claim 1, wherein the substrate is made of plastic and has a thickness of about 1 mm and is provided with a throughhole by a reactive ion etching process.

4. The method of claim 3, wherein reactive ion etching is carried out in an oxygen plasma, optionally containing argon, at a total gas flow of about 5 to about 100 sccm, a pressure ranging from about 1 to about 50 μbar and a single-phase D.C. bias of 200 to about 900 V for a time sufficient to obtain the desired etch depth.

5. The method of claim 1, wherein said electrode is made of aluminum and said layer acts as a black radiator.

6. The method of claim 5, wherein said layer is a black anodized layer.

* * * * *